(12) United States Patent
Ha

(10) Patent No.: US 8,154,055 B2
(45) Date of Patent: Apr. 10, 2012

(54) CMOS IMAGE SENSOR AND METHOD FOR FABRICATING THE SAME

(75) Inventor: Man-Lyun Ha, Chungcheongbuk-do (KR)

(73) Assignee: Intellectual Ventures II LLC, Wilmington, DE (US)

( * ) Notice: Subject to any disclaimer, the term of this patent is extended or adjusted under 35 U.S.C. 154(b) by 212 days.

(21) Appl. No.: 11/730,853

(22) Filed: Apr. 4, 2007

(65) Prior Publication Data

US 2007/0272981 A1 Nov. 29, 2007

(30) Foreign Application Priority Data

May 26, 2006 (KR) .......................... 10-2006-0047703

(51) Int. Cl.
*H01L 27/118* (2006.01)
*H01L 21/00* (2006.01)
*H01L 21/425* (2006.01)
*H01L 21/8238* (2006.01)

(52) U.S. Cl. ................ 257/204; 257/206; 257/E27.131; 438/57; 438/199; 438/217; 438/514; 438/525; 438/526

(58) Field of Classification Search .................. 438/199, 438/57, 217, 514, 525, 526; 257/204, 206
See application file for complete search history.

(56) References Cited

U.S. PATENT DOCUMENTS

| | | | | |
|---|---|---|---|---|
| 6,744,084 B2 * | 6/2004 | Fossum | .......................... | 257/292 |
| 2002/0090812 A1 * | 7/2002 | Chang | ........................... | 438/637 |
| 2003/0170493 A1 * | 9/2003 | Chen et al. | ..................... | 428/690 |
| 2004/0033647 A1 * | 2/2004 | Kim | .............................. | 438/154 |
| 2004/0056285 A1 * | 3/2004 | Cabral et al. | .................... | 257/288 |
| 2004/0217397 A1 * | 11/2004 | Lee | ................................ | 257/292 |
| 2005/0081168 A1 * | 4/2005 | Chen et al. | ........................ | 716/4 |
| 2005/0142482 A1 * | 6/2005 | Rho et al. | ................... | 430/270.1 |
| 2005/0253200 A1 * | 11/2005 | Murthy et al. | ................ | 257/382 |
| 2005/0266633 A1 * | 12/2005 | Gau | .............................. | 438/238 |
| 2006/0003519 A1 * | 1/2006 | Jang | ............................. | 438/222 |
| 2006/0208289 A1 * | 9/2006 | Ohkawa et al. | ............... | 257/291 |
| 2007/0012970 A1 * | 1/2007 | Mouli | ........................... | 257/292 |
| 2007/0252212 A1 * | 11/2007 | Onsongo et al. | ............. | 257/355 |

FOREIGN PATENT DOCUMENTS

| | | |
|---|---|---|
| JP | 11-317512 | 11/1999 |
| JP | 2002-057221 | 2/2002 |
| KR | 10 2003 004 9165 | 6/2003 |
| KR | 10 2004 0019988 | 3/2004 |
| KR | 10 2005 0093061 | 9/2005 |

\* cited by examiner

*Primary Examiner* — Hsien Ming Lee
*Assistant Examiner* — Kevin Parendo
(74) *Attorney, Agent, or Firm* — McAndrews, Held & Malloy, Ltd.

(57) ABSTRACT

A complementary metal-oxide semiconductor (CMOS) image sensor includes a photodiode formed in a substrate structure, first to fourth gate electrodes formed over the substrate structure, spacers formed on both sidewalls of the first to fourth gate electrodes and filled between the third and fourth gate electrodes, a first ion implantation region formed in a portion of the substrate structure below the spacers filled between the third and fourth gate electrodes, and second ion implantation regions formed in portions of the substrate structure exposed between the spacers, the second ion implantation regions having a higher concentration than the first ion implantation region.

13 Claims, 5 Drawing Sheets

CMOS IMAGE SENSOR AND METHOD FOR FABRICATING THE SAME

CROSS-REFERENCE TO RELATED APPLICATIONS

The present invention claims priority of Korean patent application number 10-2006-0047703, filed on May 26, 2006, which is incorporated by reference in its entirety.

BACKGROUND OF THE INVENTION

The present invention relates to a method for fabricating a semiconductor device, and more particularly, to a complementary metal-oxide semiconductor (CMOS) image sensor and a method for fabricating the same.

Demands for digital cameras have increased tremendously together with the development of the image communication using the internet. Furthermore, demands for miniature camera modules have increased according to the increasing supply of mobile communication terminals attached with cameras such as personal digital assistant (PDA), international mobile telecommunications-2000 (IMT-2000), and code division multiple access (CDMA).

An image sensor module using the basic composing element such as a charge coupled device (CCD) or a CMOS image sensor have been widely used for a camera module. An image sensor includes color filters to embody color images. The color filters are aligned over a photo sensing unit which receives light from outside, and generates and stores photocharges. Such color filter array (CFA) includes three colors of red (R), green (G), and blue (B), or yellow, magenta, and cyan. Generally, the three colors of red, green, and blue are used in a color filter array of a CMOS image sensor.

The image sensor is a semiconductor device which converts optical images into electrical signals. As described earlier, the CCD and CMOS image sensors are developed and widely used. The CCD includes metal-oxide semiconductor (MOS) capacitors disposed close to each other, wherein charge carriers are stored and transferred in the capacitors. On the contrary, the CMOS image sensor employs a switching method which uses a CMOS technology to form MOS transistors for the same number as the pixels, and successively detects outputs using the MOS transistors. The CMOS technology uses a control circuit and a signal processing circuit as peripheral circuits.

However, the CCD may have a number of limitations including the complicated driving method, the large power consumption, the complicated processes generally requiring many masking processes, and the difficulty to embody the signal processing circuit in the CCD chip, having complications to form one chip. Thus, researches on developing CMOS image sensors using sub-micron CMOS fabrication technology have been actively conducted to overcome such difficulties of the CCD.

The CMOS image sensor embodies images by forming a MOS transistor and a photodiode in a unit pixel, and successively detecting signals using the switching method. Using the CMOS fabrication technology may decrease power consumption, may allow performing simpler processes using approximately 20 masks compared to the CCD process using approximately 30 to 40 masks, and may allow forming one chip with various signal processing circuits.

Generally, the CMOS image sensor includes a photo sensing unit for sensing light and a logic circuit unit for processing the light sensed through the photo sensing unit into an electrical signal to convert into data. Attempts have been made to increase a ratio of a surface area of the photo sensing unit with respect to the total area of the image sensor device to increase photo sensitivity. Hereinafter, such ratio is referred to as a fill factor. However, it may be difficult to increase the fill factor within a limited surface area because the logic circuit unit may not be fundamentally removed.

FIG. 1 illustrates a circuit diagram showing a unit pixel of a typical CMOS image sensor. The unit pixel includes one photodiode and four N-channel MOS (NMOS) transistors. In more detail, the unit pixel includes: the photodiode for receiving incident light and generating photocharges; a transfer transistor Tx for transferring the accumulated photocharges from the photodiode to a floating diffusion region FD; a reset transistor Rx for setting an electric potential of the floating diffusion region FD to a desired value and discharging the photocharges to reset the floating diffusion region FD; a drive transistor Dx for receiving a voltage of the floating diffusion region FD through a gate and thus functioning as a source follower buffer amplifier; and a select transistor Sx for performing an addressing role by switching.

FIG. 2 illustrates a simplified layout of the unit pixel of the typical CMOS image sensor shown in FIG. 1. FIG. 3 illustrates a cross-sectional view of the unit pixel shown in FIG. 2 in a direction along a perforated line I-I'.

Referring to FIGS. 2 and 3, a method for fabricating a typical CMOS image sensor is described as follows. A P$^-$ epitaxial layer 12 lowly doped with P-type impurities is grown over a P$^+$ substrate 11 highly doped with P-type impurities. A shallow trench isolation (STI) process is performed on certain portions of the P$^-$ epitaxial layer 12 to form isolation structures 13 for isolating unit pixels. A subsequent thermal treatment process is performed to form a P$^-$ well 14 in a certain portion of the P$^-$ epitaxial layer 12 through lateral diffusion in a manner that the P$^-$ well 14 includes the drive transistor Dx and the select transistor Sx.

A third gate electrode 17C of the drive transistor Dx and a fourth gate electrode 17D of the select transistor Sx are formed over the P$^-$ well 14, and a first gate electrode 17A of the transfer transistor Tx and a second gate electrode 17B of the reset transistor Rx are formed over the P$^-$ epitaxial layer 12. At this time, each of the first to fourth gate electrodes 17A, 17B, 17C, and 17D of the four transistors includes a gate oxide layer 15 and a polysilicon layer 16.

A low concentration ion implantation process using N-type impurities is performed on a portion of the P$^-$ epitaxial layer 12 exposed on one side of the first gate electrode 17A of the transfer transistor Tx, i.e., a photodiode region, to form an N$^-$ diffusion layer 18.

A low concentration ion implantation process using N-type impurities is performed on portions of the substrate structure exposed on both sides of the third gate electrode 17C of the drive transistor Dx and the fourth gate electrode 17D of the select transistor Sx to form lightly doped drain (LDD) regions 19, which are lowly doped ion implantation regions. Although not illustrated, such LDD regions may be formed in other portions of the substrate structure exposed on both sides of the first and second gate electrodes 17A and 17B of the transfer transistor Tx and the reset transistor Rx, respectively.

A low concentration ion implantation process using P-type impurities is performed with an ion implantation tilt angle to form halo regions 20 between the LDD regions 19. The halo regions 20 are lowly doped ion implantation regions. The LDD regions 19 and the halo regions 20 are formed to reduce a short channel effect of the transistors.

An insulation layer for use as spacers is formed over the resultant substrate structure in a manner to cover the first to fourth gate electrodes 17A, 17B, 17C, and 17D of the transistors. A blanket etch process such as an etch-back process is then performed to form spacers 21 on both sidewalls of the first to fourth gate electrodes 17A, 17B, 17C, and 17D.

P-type impurities are ion implanted with a low ion implantation energy into a portion of the substrate structure exposed on one side of the transfer transistor Tx to form a $P^0$ diffusion layer 22 in the $N^-$ diffusion layer 18. Thus, a shallow PN junction including the $P^0$ diffusion layer 22 and the $N^-$ diffusion layer 18 is formed, and a PNP type photodiode including the $P^-$ epitaxial layer 12, the $P^0$ diffusion layer 22 and the $N^-$ diffusion layer 18 is formed.

A high concentration ion implantation process using N-type impurities is performed on portions of the substrate structure exposed on both sides of the first to fourth gate electrodes 17A, 17B, 17C, and 17D of the transistors to form a first to a fourth highly doped ion implantation regions 23A, 23B, 23C, and 23D. The first highly doped ion implantation region 23A will function as a floating diffusion region FD. Processes for forming metal lines, color filters, and micro lenses are then performed to form the image sensor.

FIG. 4 illustrates an enlarged cross-sectional view of a region 'A' of the typical CMOS image sensor shown in FIG. 3. Referring to FIGS. 3 and 4, the first highly doped ion implantation region 23A formed between the first gate electrode 17A of the transfer transistor Tx and the second gate electrode 17B of the reset transistor Rx is used as a floating diffusion region FD. The second highly doped ion implantation region 23B formed between the second gate electrode 17B of the reset transistor Rx and the third gate electrode 17C of the drive transistor Dx is used as an ohmic contact layer to be coupled to a power supply voltage VDD. The fourth highly doped ion implantation region 23D formed between the fourth gate electrode 17D of the select transistor Sx and the isolation structure 13 is used as an ohmic contact layer to be coupled to an output terminal Vout. The first, second, and fourth highly doped ion implantation regions 23A, 23B, and 23D are generally required to be formed for the aforementioned functions. However, the third highly doped ion implantation region 23C formed between the third gate electrode 17C of the drive transistor Dx and the fourth gate electrode 17D of the select transistor Sx is not used as an ohmic contact layer, unlike the second and fourth highly doped ion implantation regions 23B and 23D. Thus, it is not generally required to form the third highly doped ion implantation region 23C using the high concentration ion implantation process.

As mentioned above, the CMOS image sensor may have an advantage of simplifying processes when compared to the CCD because the CMOS image sensor is formed using the CMOS fabrication technology. Furthermore, high-density pixels may be embodied by minimizing the size of the unit pixels within the permissible range of the semiconductor fabrication devices used in the CMOS fabrication technology.

However, pixels with even higher density are generally required in order to maintain the competitiveness of the CMOS image sensor. The size of the pixels is often needed to be reduced to embody such high-density pixels. However, when the pixel size is reduced, the size of the photodiode may become smaller relative to the pixel size, reducing the fill factor. Eventually, device characteristics may be deteriorated.

SUMMARY OF THE INVENTION

Embodiments of the present invention are directed to provide a CMOS image sensor, which can reduce the size of a unit pixel while maintaining the size of a photodiode such that a fill factor may not decrease.

Other embodiments of the present invention are directed to provide a CMOS image sensor, which can reduce the size of a unit pixel to embody a high-density pixel, and thus, improve the scale of integration of the image sensor.

Other embodiments of the present invention are directed to provide a CMOS image sensor, which can reduce leakage current generated in highly doped ion implantation regions composing a unit pixel.

Other embodiments of the present invention are directed to provide a CMOS image sensor, which can increase the size of a photodiode without increasing the size of a unit pixel to improve a fill factor.

Other embodiments of the present invention are directed to provide a CMOS image sensor having the aforementioned characteristics.

In accordance with an aspect of the present invention, there is provided CMOS image sensor, including: a photodiode formed in a substrate structure; first to fourth gate electrodes formed over the substrate structure; spacers formed on both sidewalls of the first to fourth gate electrodes and filled between the third and fourth gate electrodes; a first ion implantation region formed in a portion of the substrate structure below the spacers filled between the third and fourth gate electrodes; and second ion implantation regions formed in portions of the substrate structure exposed between the spacers, the second ion implantation regions having a higher concentration than the first ion implantation region.

In accordance with another aspect of the present invention, there is provided a CMOS image sensor, including: a photodiode formed in a substrate structure; first to third gate electrodes formed over the substrate structure; spacers formed on both sidewalls of the first to third gate electrodes and filled between the second and third gate electrodes; a first ion implantation region formed in a portion of the substrate structure below the spacers filled between the second and third gate electrodes; and second ion implantation regions formed in portions of the substrate structure exposed between the spacers, the second ion implantation regions having a higher concentration than the first ion implantation region.

In accordance with still another aspect of the present invention, there is provided a method for fabricating a CMOS image sensor, including: forming first to fourth gate electrodes over a substrate structure; forming a photodiode in a portion of the substrate structure exposed on one side of the first gate electrode; forming a first ion implantation region in a portion of the substrate structure exposed between the third and fourth gate electrodes; forming spacers on both sidewalls of the first to fourth gate electrodes and filled between the third and fourth gate electrodes; and forming second ion implantation regions in portions of the substrate structure exposed between the spacers, the second ion implantation regions having a higher concentration than the first ion implantation region.

In accordance with a further aspect of the present invention, there is provided a method for fabricating a CMOS image sensor, including: forming first to third gate electrodes over a substrate structure; forming a photodiode in a portion of the substrate structure exposed on one side of the first gate electrode; forming a first ion implantation region in a portion of the substrate structure exposed between the second and third gate electrodes; forming spacers on both sidewalls of the first to third gate electrodes and filled between the second and third gate electrodes; and forming second ion implantation regions in portions of the substrate structure exposed between the spacers, the second ion implantation regions having a higher concentration than the first ion implantation region.

DESCRIPTION OF SPECIFIC EMBODIMENTS

Figure 1:
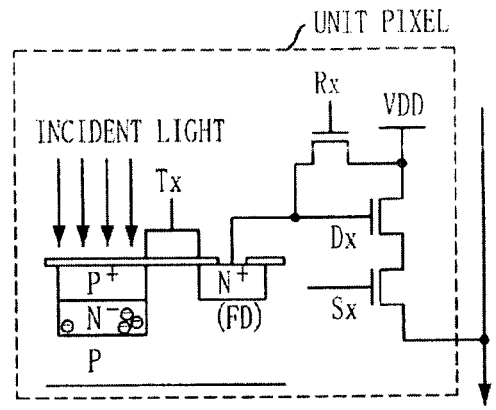
FIG. 1 illustrates a circuit diagram of a unit pixel of a typical CMOS image sensor.
Figure 2:
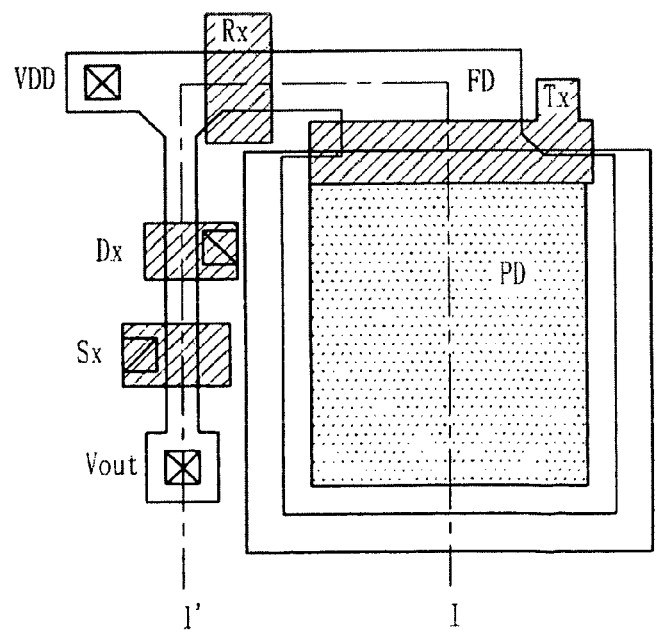
FIG. 2 illustrates a plan view of the unit pixel of the typical CMOS image sensor shown in FIG. 1.
Figure 3:
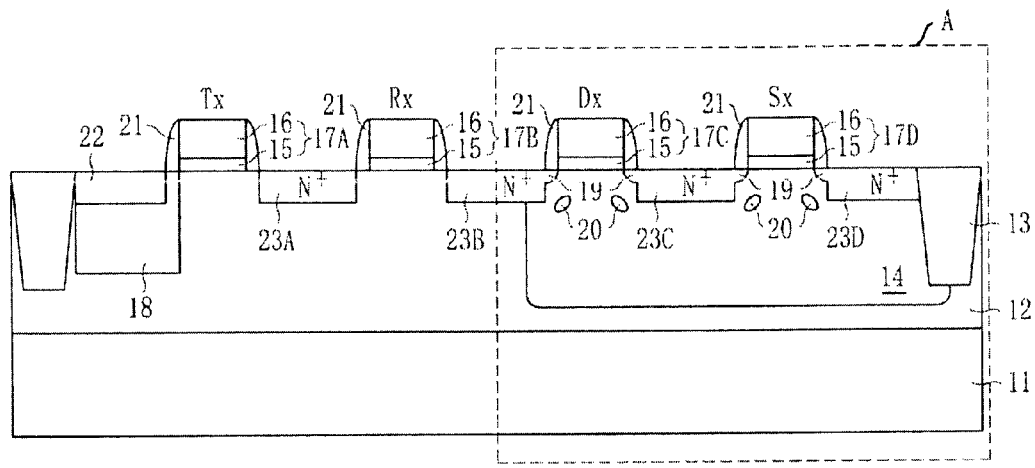
FIG. 3 illustrates a cross-sectional view of the unit pixel shown in FIG. 2 in a direction along a perforated line I-I'.

Embodiments of the present invention relate to a complementary metal-oxide semiconductor (CMOS) image sensor and a method for fabricating the same. The CMOS image sensor and the method for fabricating the same in accordance with various embodiments of the present invention will be described in detail with reference to the accompanying drawings. Also, regarding the drawings, the illustrated thickness of layers and regions are exaggerated for definitude. When a first layer is referred to as being on a second layer or "on" a substrate, it could mean that the first layer is formed right on the second layer or the substrate, or it could also mean that a third layer may exit between the first layer and the substrate. Furthermore, the same or like reference numerals through out the various embodiments of the present invention represent the same or like elements in different drawings.

As a method for improving limitations related to reducing the size of a unit pixel in a typical CMOS image sensor, a spacing distance between a gate electrode of a drive transistor Dx and a gate electrode of a select transistor Sx is minimized to reduce the size of the unit pixel compared to a unit pixel of a typical CMOS image sensor, instead of forming a highly doped ion implantation region between the gate electrode of the drive transistor Dx and the gate electrode of the select transistor Sx. When only lightly doped drain (LDD) regions exist without the highly doped ion implantation regions, a resistance between the gate electrode of the drive transistor Dx and the gate electrode of the select transistor Sx may increase. Such increased resistance may be sufficiently compensated by reducing the spacing distance between the gate electrode of the drive transistor Dx and the gate electrode of the select transistor Sx for a certain distance.

Figure 5:
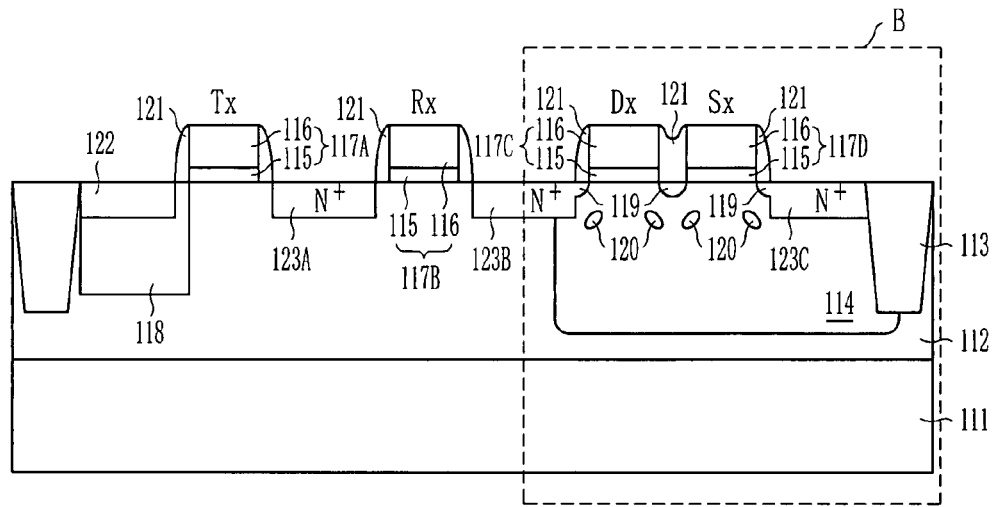
FIG. 5 illustrates a cross-sectional view of a unit pixel of a CMOS image sensor according to an embodiment of the present invention.
Figure 6:
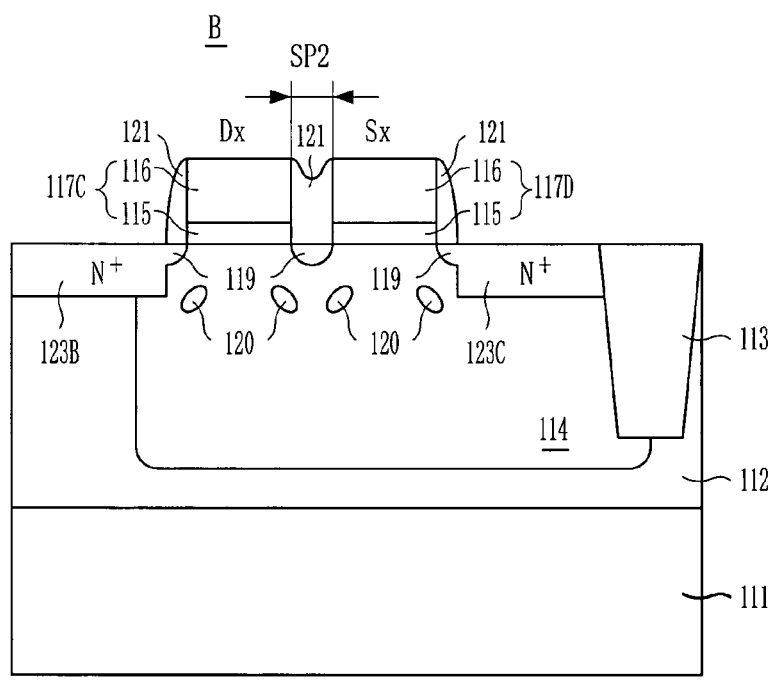
FIG. 6 illustrates an enlarged cross-sectional view of a region 'B' shown in FIG. 5.

FIG. 5 illustrates a cross-sectional view to describe a structure of a CMOS image sensor according to an embodiment of the present invention. FIG. 6 illustrates an enlarged cross-sectional view of a region 'B' shown in FIG. 5.

Referring to FIGS. 5 and 6, the CMOS image sensor, includes a third gate electrode 117C of a drive transistor Dx and a fourth gate electrode 117D of a select transistor Sx disposed closely to each other in a manner that a subsequent spacer 121 may fill between the third and fourth gate electrodes 117C and 117D. At this time, a spacing distance SP2 between the third and fourth gate electrodes 117C and 117D may be minimized. For instance, the spacing distance SP2 may be within a range between approximately 50 nm and approximately 150 nm in a device having a line width of approximately 80 nm or less. Furthermore, LDD regions 119 and halo regions 120 are formed between the third and fourth gate electrodes 117C and 117D. Benefits of the CMOS image sensor having the aforementioned structure according to the embodiment of the present invention are described as follows.

Figure 4:
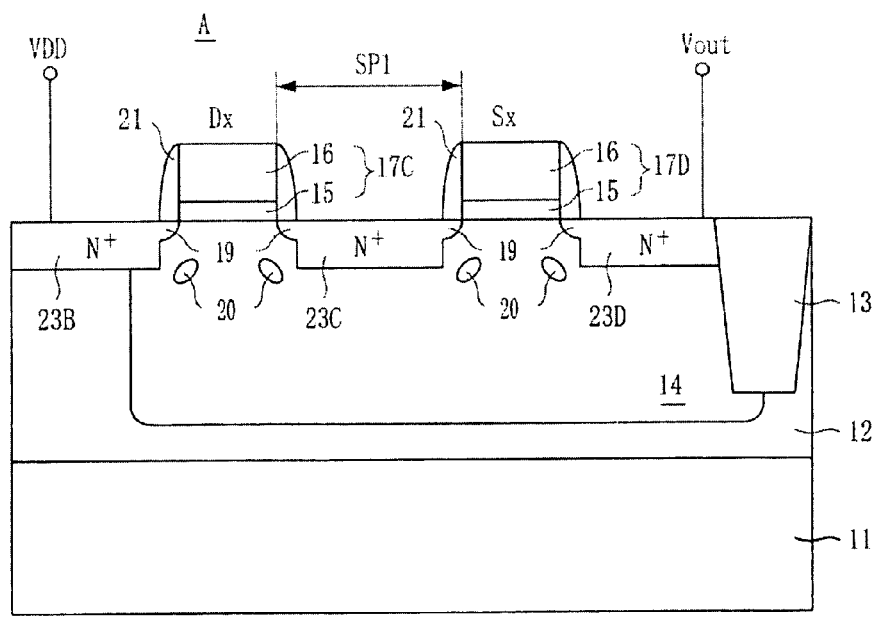
FIG. 4 illustrates an enlarged cross-sectional view of a region 'A' shown in FIG. 3.

The size of the unit pixel may be decreased when compared to a typical CMOS image sensor by minimizing the spacing distance SP2 between the third gate electrode 117C of the drive transistor Dx and the fourth gate electrode 117D of the select transistor Sx. That is, the fourth gate electrode 117D of the select transistor Sx is moved toward the third gate electrode 117C of the drive transistor Dx. Thus, the spacing distance SP2 between the third and fourth gate electrodes 117C and 117D becomes smaller than a typical spacing distance SP1 (refer to FIG. 4) between a gate electrode of a drive transistor Dx and a gate electrode of a select transistor Sx of a typical CMOS image sensor. The typical spacing distance SP1 is approximately 200 nm or greater. Accordingly, the size of the unit pixel in accordance with this embodiment may be reduced by as much as the decreased spacing distance when compared to the typical CMOS image sensor.

Moving and forming the fourth gate electrode 117D of the select transistor Sx toward the third gate electrode 117C of the drive transistor Dx may secure a marginal area by as much as the distance the third gate electrode 117C moved. The size of the photodiode may be increased by enlarging the photodiode using the secured marginal area. Consequently, according to the embodiment of the present invention, the size of the photodiode in the unit pixel may be increased to improve the fill factor while securing the unit pixel to have substantially the same area as the unit pixel in the typical CMOS image sensor.

A high-density pixel may be embodied according to the embodiment of the present invention by reducing the size of the unit pixel to a smaller size than the unit pixel of the typical CMOS image sensor. Thus, the scale of integration of the image sensor may be improved.

The highly doped ion implantation region is not formed in the substrate structure between the third gate electrode 117C of the drive transistor Dx and the fourth gate electrode 117D of the select transistor Sx. Thus, the number (or the area) of the highly doped ion implantation regions is decreased when compared to the unit pixel of the typical CMOS image sensor. Accordingly, the leakage current generated in the highly doped ion implantation regions may be decreased.

Figure 7A:
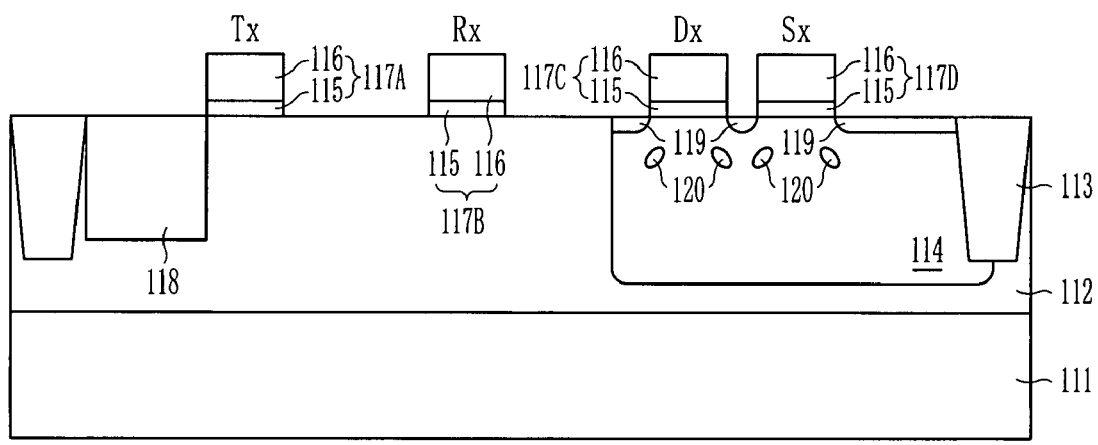
FIGS. 7A to 7C illustrate cross-sectional views of a method for fabricating the CMOS image sensor shown in FIG. 5.
Figure 7B:
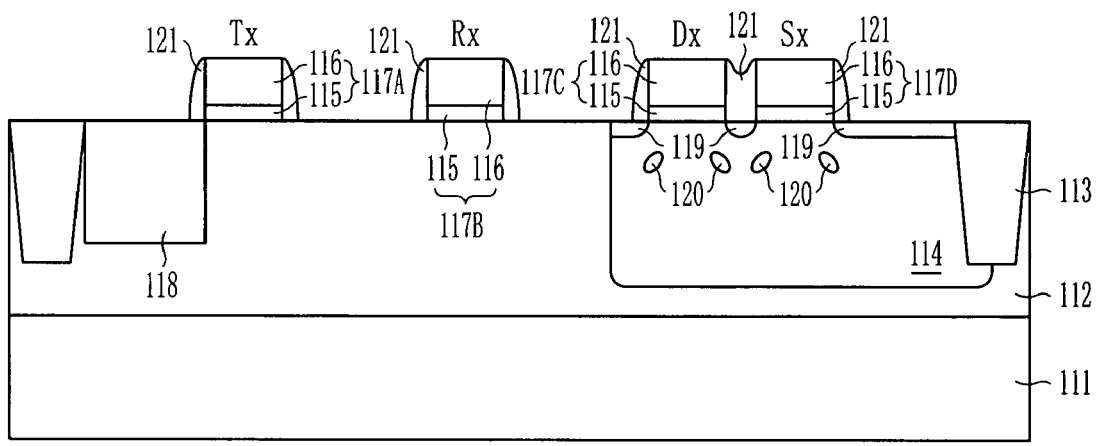
Figure 7C:
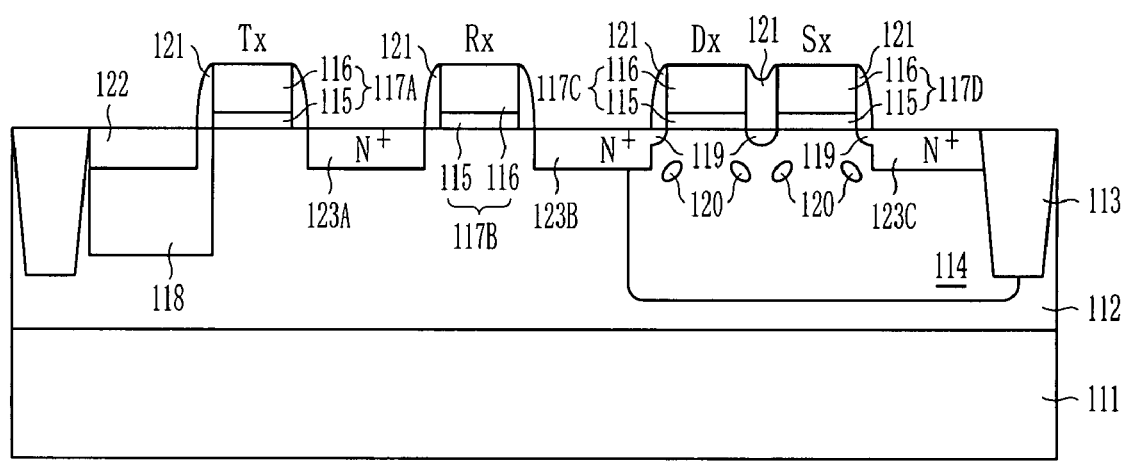

FIGS. 7A to 7C illustrate cross-sectional views of a method for fabricating the CMOS image sensor shown in FIG. 5 according to an embodiment of the present invention.

Referring to FIG. 7A, a substrate 111 on which a P⁻ epitaxial layer 112, isolation structures 113, and P⁻ well 114 are formed is provided. A pre-gate oxide layer and a pre-polysilicon layer are sequentially formed over the substrate 111. A dry etch process is performed to form a first gate electrode 117A of a transfer transistor Tx, a second gate electrode 117B of a reset transistor Rx, a third gate electrode 117C of a drive transistor Dx, and a fourth gate electrode 117D of a select transistor Sx. Each gate electrode includes a gate oxide layer 115 and a polysilicon layer 116. At this time, the fourth gate electrode 117D of the select transistor Sx is formed adjacent to the third gate electrode 117C of the drive transistor Dx. For instance, the third gate electrode 117C and the fourth gate electrode 117D are formed in a manner that a spacing distance (refer to "SP2" in FIG. 6) between the third and fourth gate electrodes 117C and 117D becomes approximately 150 nm or less.

A low concentration ion implantation process using N-type impurities is performed with a high ion implantation energy on a portion of the P⁻ epitaxial layer 112 exposed on one side of the first gate electrode 117A of the transfer transistor Tx to form a N⁻ diffusion layer 118.

A low concentration ion implantation process is performed on portions of the P⁻ epitaxial layer 112 and the P⁻ well 114 exposed on both sides of the third and fourth gate electrodes 117C and 117D of the drive transistor Dx and the select transistor Sx to form LDD regions 119. Although not illustrated, the LDD regions 119 may be formed in portions of the P⁻ epitaxial layer 112 exposed on both sides of the first and second gate electrodes 117A and 117B of the transfer transistor Tx and the reset transistor Rx.

A low concentration ion implantation process using P-type impurities is performed with an ion implantation tilt angle to form halo regions 120 between the LDD regions 119. The halo regions 120 are lowly doped ion implantation regions.

Referring to FIG. 7B, an insulation layer (not shown) for use as spacers is formed over the resultant substrate structure in a manner to cover the first to fourth gate electrodes 117A, 117B, 117C, and 117D. At this time, the insulation layer is formed to fill the space between the third and fourth gate electrodes 117C and 117D of the drive transistor Dx and the select transistor Sx. The insulation layer is formed over the other parts of the substrate structure according to the different heights. This result is derived because the spacing distance between the third and fourth gate electrodes 117C and 117D of the drive transistor Dx and the select transistor Sx is maintained at approximately 150 nm or less. That is, the spacing distance between the third and fourth gate electrodes 117C and 117D is sufficiently small during a deposition process for the insulation layer, causing the insulation layer to be filled between the third and fourth gate electrodes 117C and 117D instead of being formed according to different heights.

An etch-back process or a blanket etch process is performed to form spacers 121 on both sidewalls of the first to fourth gate electrodes 117A, 117B, 117C, and 117D. The spacers 121 between the third and fourth gate electrode 117C and 117D are formed in a mutually-coupled structure (a filled structure). At this time, the spacers 121 may include a single layer or multiple layers. For instance, the spacers 121 may include a single layer to simplify the process. The process may be further simplified by minimizing the spacing distance between the third and fourth gate electrodes 117C and 117D such that the spacers 112 including a single layer may fill between the third and fourth gate electrodes 117C and 117D. The spacers 121 may include an insulation material such as a nitride-based layer, an oxide-based layer, or an oxynitride-based layer.

Referring to FIG. 7C, P-type impurities are implanted with a low ion implantation energy into a portion of the substrate structure exposed on one side of first gate electrode 117A of the transfer transistor Tx to form a P⁰ diffusion layer 122 in the N⁻ diffusion layer 118. Thus, a shallow PN junction including the P⁰ diffusion layer 122 and the N⁻ diffusion layer 118 is formed, and a PNP type photodiode including the P⁻ epitaxial layer 112, the P⁰ diffusion layer 122, and the N⁻ diffusion layer 118 is formed.

A high concentration ion implantation process using N-type impurities is performed to form a first highly doped ion implantation region 123A, a second highly doped ion implantation region 123B, and a third highly doped ion implantation region 123C in portions of the substrate structure between the first and second gate electrodes 117A and 117B, between the second and third gate electrodes 117B and 117C, and on one side of the fourth gate electrode 117D, respectively. At this time, the impurity ions may not be implanted into the substrate structure between the third and fourth gate electrodes 117C and 117D during the high concentration ion implantation process because the spacers 121 are thickly filled between the third and fourth gate electrodes 117C and 117D. Consequently, the highly doped ion implantation region is not formed in the substrate structure between the third and fourth gate electrodes 117C and 117D. Descriptions for subsequent processes are omitted herein because the subsequent processes are substantially the same as typical processes.

According to some embodiments of the present invention, the size of a unit pixel may be decreased when compared to a typical CMOS image sensor. According to other embodiments of the present invention, the size of a photodiode in a unit pixel may be increased to improve a fill factor while securing the unit pixel to have substantially the same area as a unit pixel in a typical CMOS image sensor. According to other embodiment of the present invention, a high-density pixel may be embodied by reducing the size of a unit pixel to a smaller size than a unit pixel of a typical CMOS image sensor. Thus, the scale of integration of the image sensor may be improved. According to other embodiments of the present invention, the number (or area) of highly doped ion implantation regions may be decreased when compared to a unit pixel of a typical CMOS image sensor. Accordingly, leakage current generated in the highly doped ion implantation regions may be decreased for the same amount. According to some embodiments of the present invention, an unnecessary region may be removed from highly doped ion implantation regions composing a unit pixel, and thus, the size of the unit pixel may be decreased by as much as the surface area occupied by the unnecessary region.

While the present invention has been described with respect to the specific embodiments, the embodiments have been illustrated for description, and not for limitation. In particular, although the embodiments describe the CMOS image sensor including the unit pixel composed of four transistors, the embodiments of the present invention may be applied to a CMOS image sensor including a unit pixel composed of three transistors. Furthermore, it will be apparent to those skilled in the art that various changes and modifications may be made without departing from the spirit and scope of the invention as defined in the following claims.

What is claimed is:

1. A complementary metal-oxide (CMOS) image sensor, comprising:
   a photodiode formed in a substrate structure;
   an active region formed in the substrate;
   a select transistor gate electrode and a drive transistor gate electrode both formed over the active region;
   a shared spacer formed between the select transistor gate electrode and the drive transistor gate electrode, wherein the shared spacer comprises one or more of a nitride-based layer, an oxide-based layer, or an oxynitride-based layer, and wherein the shared spacer is configured to block implantation of impurity ions; and
   a plurality of ion implantation regions formed in the active region, wherein the plurality of ion implantation regions include one or both of floating diffusion regions or ohmic contact regions, wherein the plurality of ion implantation regions is not underneath the shared spacer, and wherein the plurality of ion implantation regions is not formed in the active region between the select transistor gate electrode and the drive transistor gate electrode.

2. The CMOS image sensor of claim 1, wherein the select transistor gate electrode and the drive transistor gate electrode are separated from each other by a distance corresponding to the shared spacer.

3. The CMOS image sensor of claim 2, wherein the distance between the select transistor gate electrode and the drive transistor gate electrode ranges from 50 nm to 150 nm.

4. The CMOS image sensor of claim 1, further comprising a well region formed below both the select transistor gate electrode and the drive transistor gate electrode.

5. The CMOS image sensor of claim 1, further comprising both a transfer transistor gate electrode and a reset transfer gate electrode on the substrate structure.

6. The CMOS image sensor of claim 5, wherein a first distance between the transfer transistor gate electrode and the reset transfer gate electrode is greater than a second distance between the select transistor gate electrode and the drive transistor gate electrode.

7. The CMOS image sensor of claim 1, wherein the shared spacer is formed between a side of the select transistor gate electrode and a side of the drive transistor gate electrode, and wherein top surfaces for each of the select and drive transistor gate electrodes are exposed.

8. A method of fabricating a complementary metal-oxide semiconductor (CMOS) image sensor, the method comprising:
   forming an active region over a substrate structure;
   forming both a select transistor gate electrode and a drive transistor gate electrode over the active region;
   forming a photodiode in a portion of the substrate structure;
   forming a shared spacer between the select transistor gate electrode and the drive transistor gate electrode to block implantation of impurity ions, wherein the shared spacer includes one or more of a nitride-based layer, an oxide-based layer, or an oxynitride-based layer; and
   forming a plurality of ion implantation regions in the active region, wherein the plurality of ion implantation regions include one or both of floating diffusion regions or ohmic contact regions, wherein the plurality of ion implantation regions is not underneath the shared spacer, and wherein the plurality of ion implantation regions is not formed in the active region between the select transistor gate electrode and the drive transistor gate electrode.

9. The method of claim 8, wherein the select transistor gate electrode and the drive transistor gate electrode are separated from each other by a distance corresponding to the shared spacer.

10. The method of claim 9, wherein the distance between the select transistor gate electrode and the drive transistor gate electrode ranges from 50 nm to 150 nm.

11. The method of claim 9, wherein said forming a plurality of ion implantation regions comprises performing an ion implantation process to form at least one of the plurality of ion implantation regions.

12. The method of claim 8, further comprising forming both a transfer transistor gate electrode and a reset transfer gate electrode on the substrate structure.

13. The method of claim 12, wherein a first distance between the transfer transistor gate electrode and the reset transfer gate electrode is greater than a second distance between the select transistor gate electrode and the drive transistor gate electrode.

* * * * *

UNITED STATES PATENT AND TRADEMARK OFFICE
CERTIFICATE OF CORRECTION

| | | |
|---|---|---|
| PATENT NO. | : 8,154,055 B2 | Page 1 of 1 |
| APPLICATION NO. | : 11/730853 | |
| DATED | : April 10, 2012 | |
| INVENTOR(S) | : Ha | |

It is certified that error appears in the above-identified patent and that said Letters Patent is hereby corrected as shown below:

In Column 5, Line 22, delete "DESCRIPTION" and inset -- DETAILED DESCRIPTION --, therefor.

In Column 5, Line 35, delete "exit" and inset -- exist --, therefor.

In Column 5, Line 59, delete "sensor," and inset -- sensor --, therefor.

Signed and Sealed this
Twenty-third Day of October, 2012

David J. Kappos
*Director of the United States Patent and Trademark Office*